United States Patent
McCarthy et al.

(10) Patent No.: US 7,956,617 B1
(45) Date of Patent: Jun. 7, 2011

(54) TESTING CIRCUITS FOR DEGRADATION WITHOUT REMOVAL FROM HOST EQUIPMENT

(75) Inventors: Charles C. McCarthy, Baltimore, MD (US); Theodore J. Riccio, Palacios, TX (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 171 days.

(21) Appl. No.: 12/357,237

(22) Filed: Jan. 21, 2009

(51) Int. Cl.
*G01R 31/02* (2006.01)
(52) U.S. Cl. ....................................................... 324/537
(58) Field of Classification Search .................. None
See application file for complete search history.

(56) References Cited

U.S. PATENT DOCUMENTS

| 6,940,296 B2 * | 9/2005 | Yamada | 324/751 |
| 2005/0264300 A1 * | 12/2005 | Chang et al. | 324/601 |

* cited by examiner

*Primary Examiner* — Jermele M Hollington
(74) *Attorney, Agent, or Firm* — Marsteller & Associates, P.C.

(57) ABSTRACT

A system (S) for testing of electronic circuits (14) includes at least one input signal (18) influenced by the tested circuit (14) for generating a resultant signal (22) conveying characteristics of selected critical performance parameters from the tested circuit (14). A reference circuit (80) receives comparable test signals (19) and produces a reference resultant signal (23). A comparator block circuit (82) further generates an output signal (52) that results from an application of selected comparison criteria to the signals (22 and 23). The output signal (52) is reflective of desired performance of the electronic circuit (14) that is tested and deterioration with time is detected by analysis and comparison with the results of previous tests.

12 Claims, 4 Drawing Sheets

| | $2^3$ | $2^2$ | $2^1$ | $2^0$ | 2/4 |
|---|---|---|---|---|---|
| 0 | 0 | 0 | 0 | 0 | 0 |
| 1 | 0 | 0 | 0 | 1 | 0 |
| 2 | 0 | 0 | 1 | 0 | 0 |
| 3 | 0 | 0 | 1 | 1 | 1 |
| 4 | 0 | 1 | 0 | 0 | 0 |
| 5 | 0 | 1 | 0 | 1 | 1 |
| 6 | 0 | 1 | 1 | 0 | 1 |
| 7 | 0 | 1 | 1 | 1 | 1 |
| 8 | 1 | 0 | 0 | 0 | 0 |
| 9 | 1 | 0 | 0 | 1 | 1 |
| 10 | 1 | 0 | 1 | 0 | 1 |
| 11 | 1 | 0 | 1 | 1 | 1 |
| 12 | 1 | 1 | 0 | 0 | 1 |
| 13 | 1 | 1 | 0 | 1 | 1 |
| 14 | 1 | 1 | 1 | 0 | 1 |
| 15 | 1 | 1 | 1 | 1 | 1 |
*FIG. 3*
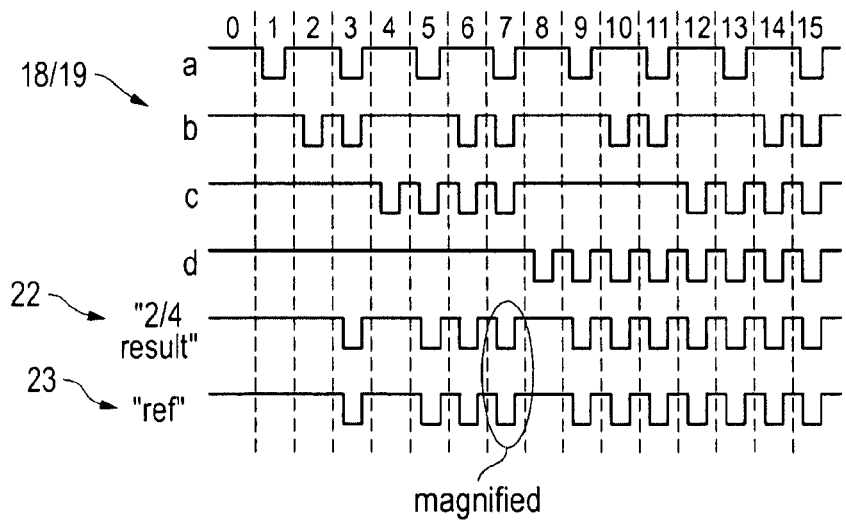
*FIG. 4*
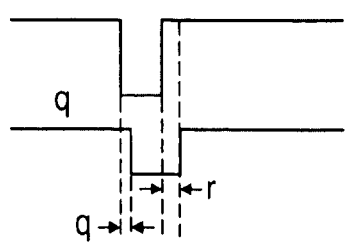
*FIG. 4A*

TESTING CIRCUITS FOR DEGRADATION WITHOUT REMOVAL FROM HOST EQUIPMENT

BACKGROUND OF THE INVENTION

1. Technical Field

The invention relates to the field of electronic circuitry testing, and more particularly to testing of revocable circuitry elements without the need of their removal from host equipment.

2. Background Art

Certain applications, such as the safe operation of nuclear power plants, rely on critical electronic systems to protect the plant, operating personnel and the public. To insure this equipment is operational, periodic testing is performed. The periodic testing may insure that the equipment is operational at the specific time of the test, but the equipment may be prone to undetected failure during periods between tests, which may reduce the safe or continued reliable operation of the nuclear plant, for instance. (Redundancy may be used to mitigate this risk.) Furthermore, many systems contain built-in functional test equipment that facilitates testing with the electronic circuitry boards installed in the equipment.

Since electronic equipment and its design may be under strict regulatory oversight, such as in the nuclear power generation industry, there is reluctance to replace equipment as it ages. Furthermore, the application of the equipment makes it undesirable from a safety aspect to remove a redundant set of equipment from service for other than the briefest period of time. To bring the entire plant to a shutdown condition to test the equipment more thoroughly is economically very undesirable. As electronic equipment ages, known degradation mechanisms may make the equipment more prone to failure, and the restrictions on removal from service for significant periods of time make it difficult to discover and diagnose these degradations.

To minimize the risk of equipment failing undetected due to aging, which may either compromise safety or compromise plant operations, some equipment owners remove electronic circuit boards from use in the host equipment and aggressively test them in test fixtures which examine them more closely than they can be examined in the system. This testing goes beyond the simple testing that is built into the host equipment.

However, this approach including circuit board removal may cause handling risks to the boards and requires extended durations of down-time to complete.

While built-in test circuits are not uncommon in many critical applications, built in test circuits that can predict an impending failure, especially without applying additional stress to the circuit, are believed to be unknown. Thus the major feature of the present invention is the ability to do detailed analysis on the performance of the circuitry under test to determine if the circuit's electronics are aging (i.e. deteriorating over time) without having to remove the circuit card from its environment.

Since removal and handling and testing in foreign apparatus is understood to be a risk for a critical circuit, in a nuclear power plant, where aging electronics are the norm, the ability to identify deterioration due to aging mechanisms without increasing the risk that these aging, and hence more fragile circuit cards, will actually fail is of great financial interest to the system owner/operator. A seemingly random failure of a circuit can cause a power plant to shut down. Unanticipated shutdowns take hours if not days to diagnose, understand, investigate and document before the plant can be restored to generating electricity. Lost revenue for each day the plant is not operating may be in the order of $1M.

While the above cited references introduce and disclose a number of noteworthy advances and technological improvements within the art, none completely fulfills the specific objectives achieved by this invention.

DISCLOSURE OF INVENTION

In accordance with the present invention, a system for testing of electronic circuits includes at least one input signal influenced by the tested circuit for generating a resultant signal conveying characteristics of selected critical performance parameters from the tested circuit. A reference circuit receives comparable test signals and produces a reference resultant signal. A comparator block circuit further generates an output signal that results from an application of selected comparison criteria to the signals. The output signal is reflective of desired performance of the electronic circuit that is tested.

These and other objects, advantages and preferred features of this invention will be apparent from the following description taken with reference to the accompanying drawings, wherein is shown the preferred embodiments of the invention.

BRIEF DESCRIPTION OF DRAWINGS

A more particular description of the invention briefly summarized above is available from the exemplary embodiments illustrated in the drawing and discussed in further detail below. Through this reference, it can be seen how the above cited features, as well as others that will become apparent, are obtained and can be understood in detail. The drawings nevertheless illustrate only typical, preferred embodiments of the invention and are not to be considered limiting of its scope as the invention may admit to other equally effective embodiments.

FIG. 3 is an exemplary logic or truth table for a 2/4 circuit.

FIG. 4 is a series of test signal traces that may be applied to a 2/4 logic block.

FIG. 4a is a magnified portion of certain test signal traces of FIG. 4.

MODE(S) FOR CARRYING OUT THE INVENTION

So that the manner in which the above recited features, advantages and objects of the present invention are attained can be understood in detail, more particular description of the invention, briefly summarized above, may be had by reference to the embodiment thereof that is illustrated in the appended drawings. In all the drawings, identical numbers represent the same elements.

In certain critical applications, such as the protection system for a nuclear power plant, complex combinational electronic circuits are used. Typically, these include redundant circuitry or even complete secondary electronic circuit boards to prevent the failure of one of the redundant systems from obviating protection of the reactor or other critical application.

Figure 1:
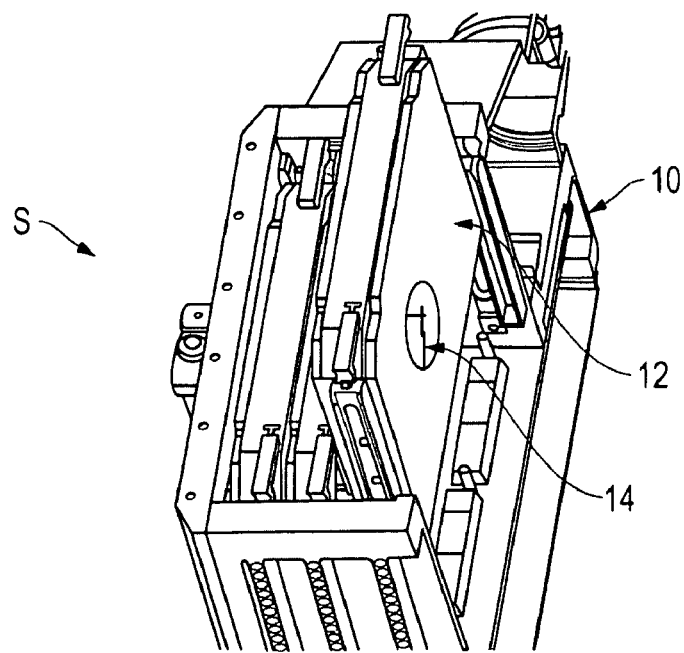
FIG. 1 is an exemplary removable circuitry board from a host electronic device.

FIG. 1 illustrates the present system S that is formed into or included with the circuitry of a host equipment chassis 10 of the type having at least one removable electronic or electromechanical circuit board 12 with embedded or imprinted circuitry 14. The host equipment unit 10 itself forms one component of a larger system that is being controlled (not shown).

Since a nuclear reactor or other larger functional system or complex (the "functional complex") being electronically controlled or monitored is operating most of the time, and since it is undesirable to shut down the reactor for testing, the present invention includes a scheme or system S to test each electronic component or sub-components of the system periodically and rapidly in order that its effective removal from service during testing is only a small compromise on the protection scheme of the reactor. More thorough testing would often require the circuit boards 12 to be removed from the host equipment 10 and tested on the "bench" or other testing device separate from the host equipment 10. This would be unacceptable due to the time involved, except on those rare occasions when the reactor or other critical functional complex was at shutdown. Furthermore, removing and handling the circuit cards 12 increases the risk of handling or test-stress induced failure of what may be fragile electronic circuitry as discussed above.

As these functional complexes are qualified for the application in the nuclear power generation industry, for example, there is often considerable reluctance to replace them with "new" equipment in the nuclear power generation industry, for example. Thus, there is a need for a means to rapidly assess the potential aging related degradation of the equipment without the need to remove the cards 12 from the equipment 10.

Figure 2:
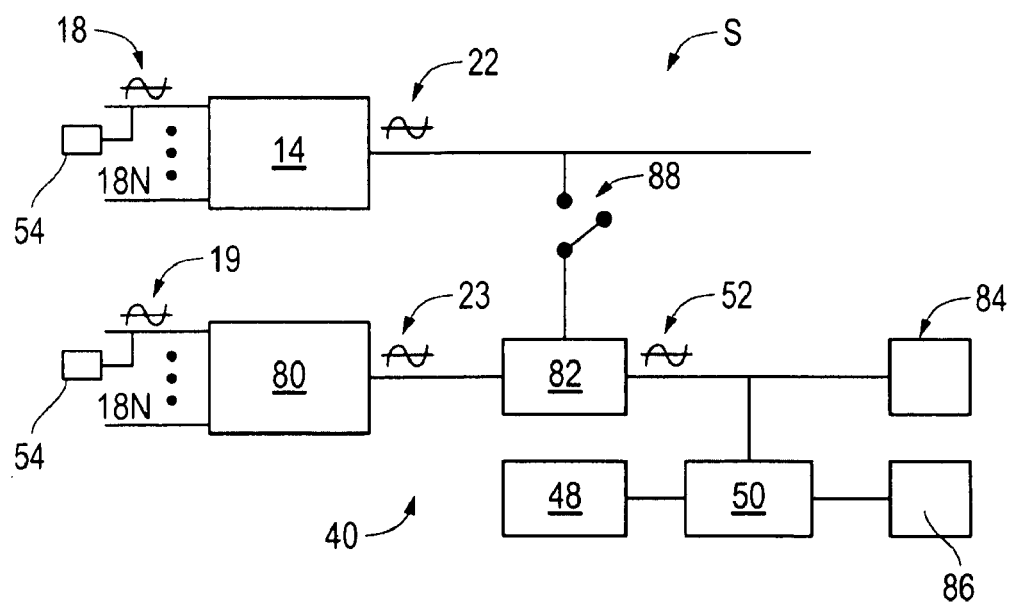
FIG. 2 is a block diagram illustrating various inputs and functions of the testing system of the present invention.

With particular reference to the block diagram of FIG. 2, the method for completing the electronic circuitry testing of the present invention S includes an electronic circuit test group or means 40 to detect changes in critical performance parameters of the electronic circuits 14 formed with the circuit boards 12 (for example Propagation delay changes) by extension of pulse based testing with signals 18 that are either existing (as described in the example for the referenced equipment, such as may be called a "Solid State Protection System") or added for the purpose of the aging testing described as follows in the detailed description. In such as case in which the test signal 18 is introduced or added to the electronic circuit 14 to be tested, the test signal 18 may originate from an external generator or source 54 or generated elsewhere in the host equipment 10.

In general, a system S for testing of electronic circuits 14 includes at least one input signal 18 influenced or processed by the electronic circuit 14 to be tested for generating a resultant test signal 22 from the tested electronic circuit. The resultant test signal 22 conveys characteristics of selected critical performance parameters from the electronic circuit 14 to be tested simply by the normal processing of the signal by the electronic circuitry.

An identical or comparable input signal 19 is communicated to a parallel reference circuit 80 for processing of the input signal 19 and generating a resulting output test signal 23 similar to that signal 22 generated by the circuit to be tested 14. In a typical scenario the reference circuit 80 replicates or even duplicates the circuitry 14 of the host equipment 10 to be tested. The reference circuit 80 should be known to function properly in order to provide a baseline for comparison purposes. It should also be understood that input signal 19 to the reference circuit may be the same signal as the input signal 18 into the circuit to be tested 14.

The output signals 22 and 23 are communicated or passed to a comparator unit 82 that processes the two signals to determine the existence of selected parameters that are or may be indicative of potential circuitry failure or other undesirable characteristics attributable to the electronic circuit 14 being tested.

The electronic testing (including the comparator and timing) component 40 of the present invention S may measure subtle changes in the performance of the circuitry 14 under test from one monthly or periodic test interval to the next (or with an array of historical data) with the information maintained with a known type of memory or storage component 48 for storage of the data from the testing, such as wave form, amplitude, or timing information or the like, for subsequent access, exchange, or use. Thus, any performance differences due to aging, including trending, can be detected.

Figure 7:
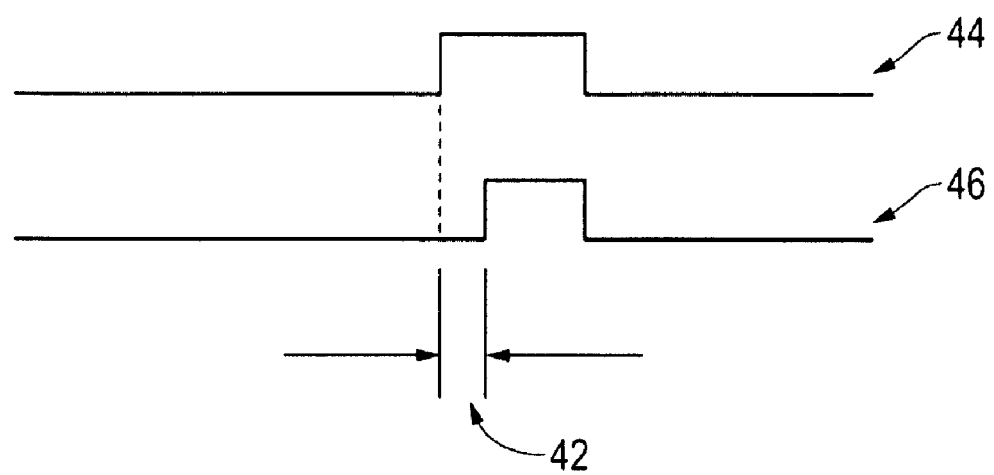
FIG. 7 is a series of signals indicating a change in propagation delay through the tested circuits as compared against a stable reference circuit.

One such subtle difference might be the difference in arrival time of the test pulse as compared with the return pulse. This change in propagation delay through the tested circuits 14 as compared against a stable reference circuit may be a potential indicator of system changes that might be precursors of failure due to aging. This is illustrated in FIG. 7 with delay 42 being shown between a test pulse 44 and a return pulse 46.

Since each of the circuits tested 14 may be comprised of different logic combinations, differences in arrival times are already expected, and accommodated during the exclusive or-ing as will be described following. However, good repeatability of arrival time difference is expected for each of the individual circuits under test, if they continue to operate in a time-stable mode. Further, if some mechanism changes the circuit 14, such as degradation due to aging, a difference in arrival times may be predicted. Thus monitoring and recording arrival time differences in a storage component 48 for the equipment at each periodic test interval could indicate a change (degradation) in the circuits 14 being tested. Thus, the basic in-situ test for operability is enhanced to check for changes over time. Comparison of the data from test to test for each circuit location tested could be done by computer or other computational system 50 operationally connected with the comparator unit 82 and could similarly be available for analysis by technicians and engineers responsible for testing the equipment. Significant changes in arrival times may indicate a part or parts in the tested chain of circuitry had varied since the previous test or tests, a possible indicator of wear or degradation of parts that might be a precursor to failure. The computer 50 may be used to compensate for environmental factors that effect delay times (such as temperature) that may have changed between tests. Once investigated, "weak" parts or circuit boards 12 could be replaced before failure and unsafe operation or inadvertent trips could be avoided.

For the following example, assume that the circuit of interest 14 performs digital logic functions, combinational logic functions or time delay functions, on a number of input signals (equivalent to plurality of input signals 18, such as 18A through 18N for example), and provides a resulting output signal 22 that may cause an important action to be taken in the superior system (for example, trip the reactor in a nuclear power plant.)

It is important to verify that the equipment 10 will operate when challenged. Thus, periodic testing may be done by imposing known or standardized test signals (input signals 18A through 18N) to the circuit 14 and monitoring the result.

This can be done by applying those same test signals (equivalent to input signals 19A though 19N) to a duplicated set of digital logic circuits 80 and comparing the results in the comparator unit 82. A mismatch between the behavior of blocks 14 and 80 will be detected in the comparator unit 82 and cause a test fail indication at output 84.

While the prior known testing approach is good to determine that the equipment 14 is working, it does nothing to insure that the electronic circuitry is stable and not degrading toward a future failure. (There are two types of failure—failure to trip on demand (very, very bad—but the risk is reduced by have a redundant set of equipment)—and a spurious trip, which has financial consequences. Oftentimes the possibility to trip is "single threaded" and a single failure can cause a reactor trip. The present invention is useful for both issues.)

To address this aging issue, the present invention expands upon known testing techniques by analyzing the response of the circuitry under test conditions without the need for removal of the circuit to be tested 14 from the host equipment 10. The simple comparison of the pulses 22 and 23 is augmented by an extended analysis of the returned signal 22. This analysis can be done in several ways (many of which are described below), but in all cases, since one is looking for a deterioration over time, comparison to historical data (the previous test or an array of data from the previous tests) is essential. Thus, critical data exhibited by the response of the circuit under test 14 to the test input signal or stimulus 18, is generally stored in a known type of memory or storage unit 48. Analysis of that data, including the comparison with prior data may then be done in a processing unit or block 50, which comparison can be either built into the system under test 14 or be done in external equipment. Detected significant changes may result in a an automated warning or other form of warning 86 to technical personnel responsible for the equipment who would then investigate the circuits responsible for the change and replace age-compromised circuits before the degraded circuitry fails.

The system of the present invention S and the circuit to be tested 14 may include a logic block or circuit that applies combinational or combinatorial logic to inputted signals 18 and more particular 18 through 18N in FIG. 2. In digital circuit theory, combinational logic is a type of logic circuit whose output is a pure function of the present input only. Such combinational logic of the logic block may be based on or use known digital devices such as digital logic gate type devices (an exemplary logic family that can be used in the implementation of the present invention is known as Motorola High Threshold Logic (MHTL)) to perform basic functions, such as "2/4" or "two out of four" decisions. That is to say if any two or more of four inputs are indicating unsafe operation, a decision is made to "trip" the reactor or other functional complex. Other more intricate logics may also be used as a matter of design, depending on the intended protective function and sensors, involving other types of voting (e.g. 2/3, or 2/4 with inhibits, etc.). However, for simplicity, the following illustrates testing for a 2/4 case by way of example.

FIG. 3 shows a truth table 16 for a 2/4 circuit that may be implemented in a logic block sub-circuit of the circuit to be tested 14. This specific logic structure is for exemplary purposes only.

Some possible stimuli and the results are further shown in FIG. 4.

A. Where the circuit to be tested 14 is an active low 2-out-of-4 voting circuit (2/4), the inputs would look like the signal traces in the top portion of FIG. 4, and if the circuit is working properly, the return would look as shown ("2/4" result). The reference signal 23 would be nearly identical to the output signal 22, since differences in time delays would be expected. (See the enlargement of a sample pair of pulses in FIG. 4a.) Two simple parameters to compare would be the differences "q" and "r". In normal, non-degrading circumstances, the times q and r would be expected to be the repeatable, or almost repeatable, from test to test. Certain degradations in the circuitry in block 14, however, would cause the time q or r to change. Gross changes could be noticed in one, monthly for instance, test interval. But more subtle changes, which might be expected with some aging defects, would be better detected by analyzing, by computer algorithms, perhaps rather than manually, the "progression of the disease" Other more complex analyses of pulse shape (rise time, noise, ringing, etc.) could also be done.

Figure 5:
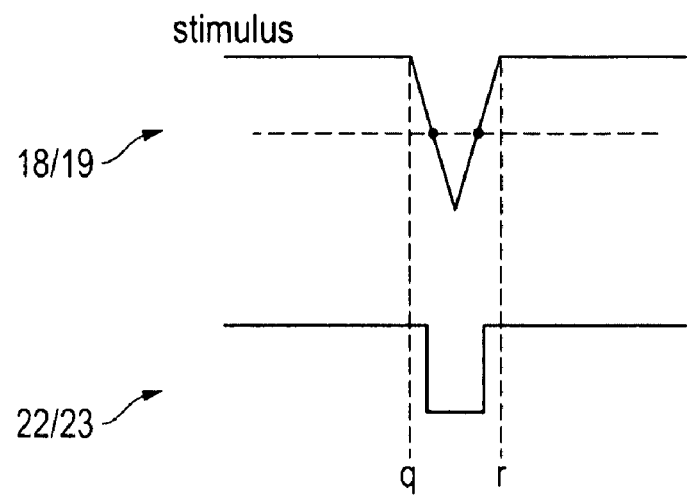
FIG. 5 is a series of exemplary signals based on a triangular wave input.

B. Other stimuli are possible and will result in other analyzable data. In FIG. 5, assume the circuit under test 14 is a simple buffer circuit, involving just one device. Here a stimulus signal 18 or 19 such as a triangular wave might yield the most information. In the case of no change (no degradation) the output signal 22 or 23 would maintain the same time relation to the respective stimulus pulse 18 or 19 (q and r for leading and trailing edges respectively), but if an aging degradation of the circuit occurred, q and/or r would vary and could be detected by the analysis circuitry 82.

Figure 6:
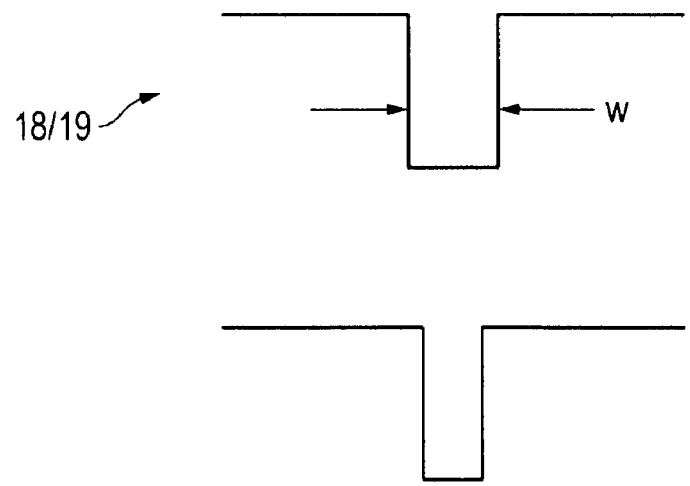
FIG. 6 is a series of exemplary signals based on varying test pulse width.

C. Another type of stimulus signal 18 or 19 could be a varying test pulse width, as exemplified in FIG. 6. For simplicity of illustration, consider the circuit under test 14 to be a buffer or a 1/1. Here, the test scheme could be simply to make the test pulse width smaller and smaller until no return was detected. By checking each time for the width of the minimum propagating pulse, changes due to aging could be detected.

Other stimuli signals 18 or 19 are also possible, such as a sine wave or tone burst, the signal chosen depending on the nature of the circuit under test, the failure modes postulated and the criticality of the proper operation of certain critical parameters. And while the emphasis in this example was on digital circuits, similar techniques with a similar approach for comparison with historical test results would apply to analog circuits.

Tolerance may be allowed in the comparison to accommodate any propagation error differences between the return pulse and the reference pulse. Multi-deck rotary switches may be used to connect the test circuit 40 described above into the operating circuitry 14 to test the cards 12, functionally, in the host environment 10. This test may be performed periodically, e.g. monthly, to insure no failures have occurred since the last test period.

However, this approach only indicates if the cards 12 are working at the time of the test. Of great interest is the ability to detect aging effects in circuits 12 or 14 that might be indicative of impeding failure in order that action may be taken in advance.

FIG. 2 depicts a single electronic circuit 14 being tested as part of the electronic test circuit 40. However, the present invention can be adapted for multiple circuits 14 that can be formed on a single circuit card 12 that is being tested with multiple input test signals 18 or it can be a plurality of distinct circuits 14.

Additionally, the test signals 18 may originate from an externally generated source 54 or an internally generated source that is included with the original electronic circuits 14.

In summary, electronic circuits 14 can be tested in place without removal from host equipment 10 by generating a resultant test signal 22 from the tested electronic circuit 14 that results from at least one input signal 18. The resultant test signal conveys characteristics of selected critical performance parameters from the electronic circuit 14 to be tested. The test signal 22 is then communicated or passed to a comparator unit or circuit 82 that generates an output signal 52 resulting from an application of one or more selected parameters to compared inputted signals 22 and 23. These steps result in the output signal 52 generated by the application of the comparator 82 to the inputted test signals 22 and 23 is reflective of desired performance of the electronic circuit 14 that is tested.

Unlike known test systems, particularly those for testing electronic equipment for use with nuclear power generation, the present invention extracts additional information from the comparison of the test signal 22 and the reference signal 23. Such additional information may include arrival time differences over time and the use of that analysis to detect deterioration (aging) of the circuits.

The testing system 40 may be removably connected to the output 22 of the circuit to be tested through a known type of switch, junction, or connection 88 or may always be connected, depending on the characteristics (such as input impedance and output drive capability) of both the circuitry under test and the comparison circuitry 82.

Alternative Embodiments

For the example system (SSPS) of the present invention S, the approach of monitoring, recording and analyzing changes in propagation delays for each of the tested circuits 14 may be the most effective method of determining degradation. Other schemes or alternative embodiments have been considered and may also be effective. Such alternative embodiments may include:

1) Applying a series of higher frequency pulses (10 as an example) to the circuits to be tested 14 for each of the lines individually—a "sick" circuit may not see all of them and thus indicate a near failure condition.

2) Applying input test signals 18 having waveforms other than pulses or square waves, thus testing the threshold of change for the digital circuits 14, and monitoring either the voltage at which they change or the time of the propagation of the changed state. This may be more effective for simpler logics—one with only one layer of combinations.

3) Single, very high frequency pulse signals that should just barely propagate through the circuit can be introduced into the circuitry. Presence of these pulses could indicate the board is operating "within spec" for propagation delays. (This approach may also include an allowance for other delays, rather than just the digital gates propagation delays.)

4) As a further variant on alternative embodiment 3 above, the test circuits could be arranged to put in or use test pulses 18 of increasing duration, starting at durations that are too fast for the circuitry under test to "see" and then stepping up the width of successive pulses until the test pattern propagates. The minimum duration pulse could be recorded and compared against future results to see whether there had been a variation that could be indicative of a change or of deterioration.

The foregoing disclosure and description of the invention are illustrative and explanatory thereof, and various changes in the size, shape and materials, as well as in the details of the illustrated construction may be made without departing from the spirit of the invention.

The invention claimed is:

1. An improved system for testing risk of failure of an electronic circuit of the type that generates at least one output signal influenced during processing by the electronic circuit to be tested, the improvement comprising:
   a memory means operationally connected with a comparator block circuit and for retaining stored historical testing data for the electronic circuit to be tested, the stored testing data capable of being accessed as desired; and,
   a comparator block circuit means electrically connected with the electronic circuit to be tested for receiving the at least one output signal from the electronic circuit to be tested and the stored testing data from the memory means; the comparator block circuit including means for generating an output signal resulting from applying desired comparison criteria to the output signals from the electronic circuit to be tested in view of the stored testing data retrieved from the memory means for determining whether performance of the electronic circuit to be tested has changed over time and the risk of failure of the electronic circuit to be tested.

2. The invention of claim 1 further including a computational means operationally connected with the comparator block circuit and the memory means for further comparing the stored testing data with the output signal from the electronic circuit to be tested and a reference circuit for determining whether change has occurred in the electronic circuit to be tested due to aging, and to determine risk of failure of the electronic circuit to be tested.

3. The invention of claim 1 further including a reference circuit being essentially a duplicate of the electronic circuit to be tested, and for producing an output signal comparable to the output signal of the electronic circuit to be tested.

4. The invention of claim 1 wherein an input signal is introduced into the electronic circuit to be tested from an external source.

5. The invention of claim 1 wherein the memory means and comparator block circuit are removably connectable to the electronic circuit to be tested.

6. The invention of claim 1 wherein comparison criteria applied by the comparator block circuit to the output signal from the electronic circuit to be tested and the stored testing data from the memory means is selected from the group consisting of differences in waveform, amplitude, timing, and propagation delays.

7. The invention of claim 1 further including a computational component operationally connected with the comparator block circuit for determining the risk of failure of the electronic circuit to be tested.

8. A method for testing of electronic circuits, the improvement comprising:
   generating at least one output signal with an existing electronic circuit to be tested; the output signal from the electronic circuit to be tested conveying characteristics of critical performance parameters for the electronic circuit to be tested;
   retrieving from a memory means stored historical testing data comparable to and representing historical data from the electronic circuit to be tested;
   comparing the output signal from the circuit to be tested with the stored testing data with a comparator block circuit means for receiving the output signal from the electronic circuit to be tested and the stored testing data and applying desired comparison criteria to the output signal of the electronic circuit to be tested and the stored testing data for determining risk of failure of the electronic circuit to be tested; and, generating an output signal with the comparator block circuit resulting from applying the desired comparison criteria to the output signals from the electronic circuit to be tested and the stored testing data for determining whether performance of the circuit to be tested has changed over time and the risk of failure of the electronic circuit to be tested.

9. The method of claim 8 further including determining whether change has occurred in the electronic circuit to be tested due to aging by a computational means operationally connected with the comparator block circuit and the memory means for comparing the stored testing data with the output signals from the electronic circuit to be tested and a reference circuit, and to determine risk of failure of the electronic circuit to be tested.

10. The method of claim 8 further including a reference circuit being essentially a duplicate of the electronic circuit to be tested, and for producing an output signal comparable to the output signal of the electronic circuit to be tested.

11. The method of claim 8 wherein an input signal is introduced into the electronic circuit to be tested from an external source.

12. The method of claim 8 wherein the memory means and comparator block circuit are removably connectable to the electronic circuit to be tested.

* * * * *